United States Patent
Rocha-Alvarez et al.

(10) Patent No.: US 6,709,721 B2
(45) Date of Patent: Mar. 23, 2004

(54) PURGE HEATER DESIGN AND PROCESS DEVELOPMENT FOR THE IMPROVEMENT OF LOW K FILM PROPERTIES

(75) Inventors: Juan Carlos Rocha-Alvarez, Sunnyvale, CA (US); Chen-An Chen, Milpitas, CA (US); Ellie Yieh, San Jose, CA (US); Shankar Venkataraman, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 131 days.

(21) Appl. No.: 09/820,586

(22) Filed: Mar. 28, 2001

(65) Prior Publication Data

US 2002/0187262 A1 Dec. 12, 2002

(51) Int. Cl.[7] ............................................... C23C 16/40
(52) U.S. Cl. .................. 427/569; 427/579; 427/578; 427/248.1; 427/249.15; 427/255.37
(58) Field of Search ........................ 427/569, 249.1, 427/249.15, 579, 578, 255.37; 438/778, 780, 786, 787

(56) References Cited

U.S. PATENT DOCUMENTS

| | | | |
|---|---|---|---|
| 3,355,078 A | 11/1967 | Smith | 228/44 |
| 3,955,163 A | 5/1976 | Novak | 355/132 |
| 4,168,330 A | 9/1979 | Kaganowicz | 427/39 |
| 4,209,357 A | 6/1980 | Gorin et al. | 156/643 |
| 4,268,330 A | 5/1981 | Komatsu et al. | 156/111 |
| RE31,053 E | 10/1982 | Firtion et al. | 355/77 |
| 4,458,746 A | 7/1984 | Holden et al. | 165/80 A |
| 4,473,455 A | 9/1984 | Dean et al. | 204/298 |
| 4,557,946 A | 12/1985 | Sacher et al. | 427/41 |
| 4,579,618 A | 4/1986 | Celestino et al. | 156/345 |
| 4,585,920 A | 4/1986 | Hoog et al. | 219/121 PR |
| 4,603,466 A | 8/1986 | Morley | 29/569 R |
| 4,707,012 A | 11/1987 | Takagi | 294/64.1 |
| 4,789,648 A | 12/1988 | Chow et al. | 437/225 |
| 4,798,629 A | 1/1989 | Wood et al. | 106/287.16 |
| 4,812,325 A | 3/1989 | Ishihara et al. | 427/69 |
| 4,824,690 A | 4/1989 | Heinecke et al. | 427/38 |
| 4,828,880 A | 5/1989 | Jenkins et al. | 427/167 |
| 4,842,888 A | 6/1989 | Haluska et al. | 427/38 |
| 4,845,054 A | 7/1989 | Mitchener | 437/238 |
| 4,853,102 A | 8/1989 | Tateishi et al. | 204/298 |
| 4,860,687 A | 8/1989 | Frijlink | 118/500 |
| 4,872,947 A | 10/1989 | Wang et al. | 156/643 |
| 4,892,753 A | 1/1990 | Wang et al. | 427/38 |

(List continued on next page.)

FOREIGN PATENT DOCUMENTS

| | | | | |
|---|---|---|---|---|
| DE | 44 04 690 A1 | 8/1995 | ........... | C23C/16/22 |
| DE | 196 54 737 A1 | 7/1997 | ........... | H01L/21/31 |
| DE | 198 04 375 A1 | 1/1999 | ......... | H01L/21/312 |

(List continued on next page.)

OTHER PUBLICATIONS

Tada, et al., "Correlation between Wetting and Structure in Methylsiloxane Layers on Oxides Formed by Chemical Vapor Surface Modification", *J. Phys. Chem.* 98(47) (1994), pp. 12452–12457.

(List continued on next page.)

*Primary Examiner*—Timothy Meeks
(74) *Attorney, Agent, or Firm*—Moser, Patterson & Sheridan

(57) ABSTRACT

The present invention provides a method of depositing a carbon doped silicon oxide film having a low dielectric constant (k). A process gas mixture containing at least a carrier gas, an oxidizer, a carbon gas source, or combinations thereof, is supplied adjacent an edge of a substrate though a purge gas inlet in a substrate support to facilitate deposition of low k carbon doped silicon oxide film having a greater concentration of silicon oxide around the edge of the substrate than an inner portion of the substrate.

22 Claims, 6 Drawing Sheets

U.S. PATENT DOCUMENTS

| | | | |
|---|---|---|---|
| 4,894,352 A | 1/1990 | Lane et al. .................. 437/238 |
| 4,900,591 A | 2/1990 | Bennett et al. ............. 427/255 |
| 4,951,601 A | 8/1990 | Maydan et al. ............. 118/719 |
| 4,973,511 A | 11/1990 | Farmer et al. .............. 428/216 |
| 4,978,412 A | 12/1990 | Aoki et al. ................. 156/345 |
| 4,981,724 A | 1/1991 | Hochberg et al. ........ 427/255.3 |
| 5,028,566 A | 7/1991 | Lagendijk ................... 437/238 |
| 5,040,046 A | 8/1991 | Chhabra et al. ............... 357/54 |
| 5,093,153 A | 3/1992 | Brochot et al. ................ 427/41 |
| 5,119,761 A | 6/1992 | Nakata ....................... 118/725 |
| 5,120,680 A | 6/1992 | Foo et al. ................... 437/238 |
| 5,124,014 A | 6/1992 | Foo et al. .............. 204/192.32 |
| 5,156,881 A | 10/1992 | Okano et al. ............... 427/572 |
| 5,182,000 A | 1/1993 | Antonelli et al. ......... 204/181.1 |
| 5,198,034 A | 3/1993 | deBoer et al. .............. 118/725 |
| 5,204,141 A | 4/1993 | Roberts et al. ............ 427/255.3 |
| 5,208,069 A | 5/1993 | Clark et al. ................. 427/226 |
| 5,224,441 A | 7/1993 | Felts et al. .................. 118/718 |
| 5,226,383 A | 7/1993 | Bhat .......................... 118/730 |
| 5,228,501 A | 7/1993 | Tepman et al. ............. 165/80.1 |
| 5,230,741 A | 7/1993 | van de Ven et al. ........ 118/728 |
| 5,231,690 A | 7/1993 | Soma et al. ................. 392/416 |
| 5,238,499 A | 8/1993 | van de Ven et al. ........ 118/724 |
| 5,246,887 A | 9/1993 | Yu .............................. 437/238 |
| 5,250,473 A | 10/1993 | Smits ......................... 437/238 |
| 5,262,029 A | 11/1993 | Erskine et al. ......... 204/298.15 |
| 5,267,607 A | 12/1993 | Wada ......................... 165/80.1 |
| 5,279,867 A | 1/1994 | Friedt et al. ................ 427/567 |
| 5,284,730 A | 2/1994 | Takei et al. ................... 430/66 |
| 5,290,736 A | 3/1994 | Sato et al. ................... 437/238 |
| 5,292,399 A | 3/1994 | Lee et al. ................... 156/643 |
| 5,292,554 A | 3/1994 | Sinha et al. ................. 427/251 |
| 5,298,587 A | 3/1994 | Hu et al. ....................... 528/10 |
| 5,304,248 A | 4/1994 | Cheng et al. ............... 118/728 |
| 5,314,724 A | 5/1994 | Tsukune et al. ............ 427/489 |
| 5,316,278 A | 5/1994 | Sherstinsky et al. .... 269/254 R |
| 5,316,645 A | 5/1994 | Yamagami et al. .... 204/298.06 |
| 5,326,725 A | 7/1994 | Sherstinsky et al. ........ 437/225 |
| 5,328,722 A | 7/1994 | Ghanayem et al. ......... 427/250 |
| 5,343,938 A | 9/1994 | Schmidt ..................... 165/80.2 |
| 5,352,294 A | 10/1994 | White et al. ................ 118/725 |
| 5,352,493 A | 10/1994 | Dorfman et al. ............ 427/530 |
| 5,360,646 A | 11/1994 | Morita ....................... 427/574 |
| 5,362,526 A | 11/1994 | Wang et al. ................. 427/573 |
| 5,364,666 A | 11/1994 | Williams et al. ............ 427/579 |
| 5,374,829 A | 12/1994 | Sakamoto et al. ..... 250/453.11 |
| 5,376,180 A | 12/1994 | Mahler ....................... 118/728 |
| 5,378,165 A | 1/1995 | Comerci et al. ............. 439/188 |
| 5,383,971 A | 1/1995 | Selbrede ..................... 118/728 |
| 5,403,459 A | 4/1995 | Guo ...................... 204/192.32 |
| 5,421,401 A | 6/1995 | Sherstinsky et al. ....... 165/80.2 |
| 5,437,752 A | 8/1995 | Lang ........................... 156/210 |
| 5,439,524 A | 8/1995 | Cain et al. ................ 118/723 E |
| 5,447,570 A | 9/1995 | Schmitz et al. ............. 118/728 |
| 5,456,756 A | 10/1995 | Ramaswami et al. ....... 118/721 |
| 5,460,703 A | 10/1995 | Nulman et al. ......... 204/192.12 |
| 5,465,680 A | 11/1995 | Loboda ........................ 117/84 |
| 5,466,431 A | 11/1995 | Dorfman et al. ............ 423/446 |
| 5,468,299 A | 11/1995 | Tsai ............................ 118/730 |
| 5,468,520 A | 11/1995 | Williams et al. ............ 427/560 |
| 5,474,612 A | 12/1995 | Sato et al. ................... 118/725 |
| 5,476,548 A | 12/1995 | Lei et al. .................... 118/728 |
| 5,488,015 A | 1/1996 | Havemann et al. ......... 437/195 |
| 5,492,736 A | 2/1996 | Laxman et al. ............. 427/579 |
| 5,494,712 A | 2/1996 | Hu et al. ..................... 427/489 |
| 5,508,368 A | 4/1996 | Knapp et al. ............... 427/534 |
| 5,516,367 A | 5/1996 | Lei et al. .................... 118/725 |
| 5,518,593 A | 5/1996 | Hosokawa et al. .... 204/192.12 |
| 5,530,581 A | 6/1996 | Cogan ........................ 359/265 |
| 5,534,072 A | 7/1996 | Mizuno et al. ............. 118/728 |
| 5,534,110 A | 7/1996 | Lenz et al. ............... 156/643.1 |
| 5,540,821 A | 7/1996 | Tepman .................. 204/192.13 |
| 5,554,570 A | 9/1996 | Maeda et al. ................ 437/235 |
| 5,556,476 A | 9/1996 | Lei et al. .................... 118/728 |
| 5,558,721 A | 9/1996 | Kohmura et al. ........... 118/730 |
| 5,559,367 A | 9/1996 | Cohen et al. ................. 257/77 |
| 5,563,105 A | 10/1996 | Dobuzinsky et al. ....... 437/240 |
| 5,574,247 A | 11/1996 | Nishitani et al. ........... 118/708 |
| 5,578,523 A | 11/1996 | Fiordalice et al. .......... 437/190 |
| 5,593,741 A | 1/1997 | Ikeda ......................... 427/579 |
| 5,598,027 A | 1/1997 | Matsuura .................... 257/635 |
| 5,599,740 A | 2/1997 | Jang et al. ................... 437/190 |
| 5,611,865 A | 3/1997 | White et al. ................ 118/725 |
| 5,616,369 A | 4/1997 | Williams et al. ............ 427/536 |
| 5,618,619 A | 4/1997 | Petrmichl et al. ........... 428/334 |
| 5,632,872 A | 5/1997 | Dattilo ................... 204/209 R |
| 5,632,873 A | 5/1997 | Stevens et al. ........ 204/298.15 |
| 5,637,351 A | 6/1997 | O'Neal et al. ............ 427/255.3 |
| 5,638,251 A | 6/1997 | Goel et al. .................. 361/313 |
| 5,665,167 A | 9/1997 | Deguchi et al. ............ 118/728 |
| 5,679,413 A | 10/1997 | Petrmichl et al. ........... 427/534 |
| 5,683,940 A | 11/1997 | Yahiro ........................ 437/195 |
| 5,693,563 A | 12/1997 | Teong ........................ 437/190 |
| 5,700,720 A | 12/1997 | Hashimoto ................. 437/195 |
| 5,703,404 A | 12/1997 | Matsuura .................... 257/758 |
| 5,703,493 A | 12/1997 | Weeks et al. ............... 324/755 |
| 5,716,486 A | 2/1998 | Selwyn et al. .............. 156/345 |
| 5,725,718 A | 3/1998 | Banholzer et al. .......... 156/345 |
| 5,728,276 A | 3/1998 | Katsuki et al. ........ 204/298.11 |
| 5,738,165 A | 4/1998 | Imai .......................... 165/80.2 |
| 5,739,579 A | 4/1998 | Chiang et al. .............. 257/635 |
| 5,749,999 A | 5/1998 | Dandia ....................... 156/285 |
| 5,753,133 A | 5/1998 | Wong et al. .................. 216/67 |
| 5,753,564 A | 5/1998 | Fukada ....................... 437/238 |
| 5,766,365 A | 6/1998 | Umotoy et al. ............. 118/728 |
| 5,789,319 A | 8/1998 | Havemann et al. ......... 438/668 |
| 5,800,877 A | 9/1998 | Maeda et al. ................ 427/535 |
| 5,807,785 A | 9/1998 | Ravi .......................... 438/624 |
| 5,810,931 A | 9/1998 | Stevens et al. .............. 118/721 |
| 5,821,168 A | 10/1998 | Jain ............................ 438/692 |
| 5,827,408 A | 10/1998 | Raaijmakers .......... 204/192.12 |
| 5,834,162 A | 11/1998 | Malba ........................ 430/317 |
| 5,851,299 A | 12/1998 | Cheng et al. ............... 118/729 |
| 5,858,880 A | 1/1999 | Dobson et al. ............. 438/758 |
| 5,860,640 A | 1/1999 | Marohl et al. .......... 269/289 R |
| 5,874,367 A | 2/1999 | Dobson ...................... 438/787 |
| 5,882,417 A | * 3/1999 | van de Ven et al. ........ 118/728 |
| 5,882,419 A | 3/1999 | Sinha et al. ................. 118/729 |
| 5,888,304 A | 3/1999 | Umotoy et al. ............. 118/720 |
| 5,888,593 A | 3/1999 | Petrmichl et al. ........... 427/563 |
| 5,891,799 A | 4/1999 | Tsui ........................... 438/624 |
| 5,961,774 A | 10/1999 | Tamura et al. .............. 156/345 |
| 5,985,033 A | 11/1999 | Yudovsky et al. .......... 118/715 |
| 6,022,809 A | 2/2000 | Fan ............................ 438/710 |
| 6,033,480 A | 3/2000 | Chen et al. ................. 118/715 |
| 6,040,011 A | 3/2000 | Yudovsky et al. ...... 427/255.28 |
| 6,054,206 A | 4/2000 | Mountsier ................. 428/312.8 |
| 6,054,379 A | 4/2000 | Yau et al. .................... 438/623 |
| 6,068,884 A | * 5/2000 | Rose et al. ............... 427/255.6 |
| 6,072,227 A | 6/2000 | Yau et al. .................... 257/642 |
| 6,124,641 A | 9/2000 | Matsuura .................... 257/759 |
| 6,140,226 A | 10/2000 | Grill et al. .................. 438/637 |
| 6,147,009 A | 11/2000 | Grill et al. .................. 438/780 |
| 6,159,871 A | 12/2000 | Loboda et al. .............. 438/786 |

FOREIGN PATENT DOCUMENTS

| | | | |
|---|---|---|---|
| DE | 199 04 311 A1 | 8/1999 | ........... C23C/16/44 |
| EP | 0 289 402 A1 | 11/1988 | ............ C09D/1/00 |
| EP | 0 343 502 A2 | 11/1989 | ........... H01L/21/00 |
| EP | 0 456 372 A1 | 11/1991 | ........... H01L/21/00 |
| EP | 0 456 426 A1 | 11/1991 | ........... H01L/21/00 |

| | | | | |
|---|---|---|---|---|
| EP | 0 467 623 A2 | 1/1992 | ........... | C23C/16/54 |
| EP | 0 489 439 A1 | 6/1992 | ........... | C23C/16/44 |
| EP | 0 519 079 A1 | 12/1992 | ......... | H01L/21/312 |
| EP | 0 522 799 A2 | 1/1993 | ........... | H01L/21/90 |
| EP | 0 533 129 A2 | 3/1993 | ........... | C23C/16/40 |
| EP | 0 589 678 A2 | 3/1994 | ........... | H01L/23/02 |
| EP | 0 595 307 A2 | 5/1994 | ........... | H01L/21/00 |
| EP | 0 598 362 A1 | 5/1994 | ........... | C23C/14/50 |
| EP | 0 619 381 A1 | 10/1994 | ........... | C23C/16/00 |
| EP | 0 650 181 A2 | 4/1995 | ............ | H01J/37/20 |
| EP | 0 688 888 A2 | 12/1995 | ........... | C23C/16/44 |
| EP | 0 708 477 A1 | 4/1996 | ........... | H01L/21/00 |
| EP | 0 711 817 A2 | 5/1996 | ......... | C09D/183/04 |
| EP | 0 721 019 A2 | 7/1996 | ........... | C23C/16/40 |
| EP | 0 743 675 A1 | 11/1996 | ......... | H01L/21/316 |
| EP | 0 747 934 A1 | 12/1996 | ........... | H01L/21/00 |
| EP | 0 771 886 A1 | 5/1997 | ........... | C23C/16/36 |
| EP | 0 774 533 A1 | 5/1997 | ........... | C23C/16/40 |
| EP | 0 721 019 A3 | 7/1997 | ......... | H01L/21/768 |
| EP | 0 825 279 A1 | 2/1998 | ........... | C23C/16/44 |
| EP | 0 926 715 A2 | 6/1999 | ....... | H01L/21/3105 |
| EP | 0 926 724 A2 | 6/1999 | ........... | H01L/21/76 |
| EP | 0 469 926 A1 | 8/1999 | .............. | C08J/7/06 |
| EP | 0 935 283 A2 | 8/1999 | ......... | H01L/21/312 |
| EP | 0 885 983 A1 | 12/1999 | ........... | C23C/16/30 |
| FR | 2.171.877 | 9/1973 | ........... | C23C/11/00 |
| GB | 2 015 983 A | 9/1979 | ........... | C03C/17/22 |
| GB | 2 316 535 A | 2/1998 | ........... | H01L/21/31 |
| JP | 59-098726 | 12/1984 | ............ | B01J/12/00 |
| JP | 59-222659 | 12/1984 | ............. | F16H/9/18 |
| JP | 60-111480 | 6/1985 | ........... | H01L/33/00 |
| JP | 61-099149 | 5/1986 | .......... | G03G/5/082 |
| JP | 01-050429 | 2/1989 | ......... | H01L/21/318 |
| JP | 05-033119 | 2/1993 | ............. | C23C/8/26 |
| JP | 05-267480 | 10/1993 | ........... | H01L/21/90 |
| JP | 06-163521 | 6/1994 | ......... | H01L/21/314 |
| JP | 06-168937 | 6/1994 | ........ | H01L/21/316 |
| JP | 08-222559 | 8/1996 | ........ | H01L/21/316 |
| JP | 08-236518 | 9/1996 | ........ | H01L/21/316 |
| JP | 08-279505 | 10/1996 | ........ | H01L/21/316 |
| JP | 08-288286 | 11/1996 | ........ | H01L/21/316 |
| JP | 09-008031 | 1/1997 | ........ | H01L/21/316 |
| JP | 09-064029 | 3/1997 | ........ | H01L/21/316 |
| JP | 09-237785 | 9/1997 | ........ | H01L/21/316 |
| JP | 09-251997 | 9/1997 | ........ | H01L/21/316 |
| JP | 09-260369 | 10/1997 | ........ | H01L/21/316 |
| JP | 10-242143 | 9/1998 | ........ | H01L/21/316 |
| JP | 10-242255 | 9/1998 | ........... | H01L/21/38 |
| JP | 11-251293 | 9/1999 | ....... | H01L/21/3065 |
| WO | 90/13687 | 11/1990 | ........... | C30B/25/10 |
| WO | 92/12535 | 7/1992 | ......... | H01L/21/312 |
| WO | 94/01597 | 1/1994 | ........... | C23C/16/04 |
| WO | 94/01885 | 1/1994 | ......... | H01L/21/316 |
| WO | 95/04373 | 2/1995 | ........... | H01L/21/68 |
| WO | 98/08249 | 2/1998 | ......... | H01L/21/312 |
| WO | 98/59089 | 12/1998 | ........... | C23C/16/30 |
| WO | 99/38202 | 7/1999 | ......... | H01L/21/312 |
| WO | 99/41423 | 8/1999 | | |
| WO | 99/55526 | 11/1999 | ............. | B23B/9/04 |
| WO | 00/01012 | 1/2000 | ........... | H01L/23/48 |

OTHER PUBLICATIONS

Grill, et al., "Novel Low k Dielectrics Based on Diamond–like Carbon Materials", *J. Electrochem. Soc.*, 145(5) (May 1998), pp. 1649–1653.

Loboda, et al., "Deposition of Low–K Dielectric Films Using Trimethylsilane", *Electrochem. Soc. Proc.*, vol. 98, pp. 145–152.

Nara, et al., "Low Dielectric Constant Insulator Formed by Downstream Plasma CVD at Room Temperature Using TMS/$O_2$", *Jap. J. Appl. Phys*, 36 (1997), pp. 1477–1480.

Ducarroir, et al., "SiCN coating prepared by PACVD from TMS–$NH_3$–Ar system on steel", *J. de Physique VI*, vol. 3 (Aug. 1993), pp. 247–253.

Bunshah, et al., *Deposition Technologies for Films and Coatings*, Noyes Publications (1982), pp. 339, 357–359, &366–367.

McClatchie, et al., "Low Dielectric Constant Oxide Films Deposited Using CVD Techniques", DUMIC Conference (Feb. 16–17, 1998), pp. 311–318.

Loboda, et al., "Using Trimethylsilane to Improve Safety, Throughput and Versatility in PECVD Processes", *Electrochem. Proc.* vol. 97–10, pp. 443–453.

Horiike, et al., "Filling of Si oxide into a deep trench using digital CVD method", *Applied Surface Science*, 46 (1990), pp. 164–174.

Noguchi, et al., Liquid Phase Oxidation Employing O Atoms Produced by Microwave Discharge and $Si(CH_3)_4$, Extended Abstr. Of $19^{th}$ Conf. on Solid State Devices and Materials, Tokyo (1987), pp. 451–454.

Moriyama, et al., "Thermal Stability of $SiN_xC_y$ Films Prepared by Plasma CVD", *J. Ceramic Soc. Of Japan*, 101(7) (1993), pp. 757–763.

Pierson, *Handbook of Chemical Vapor Deposition*, Noyes Publication (1992), pp. 208–209.

Loboda, et al., "Safe Precursor Gas For Broad Replacement of $SiH_4$ in Plasma Processes Employed in Integrated Circuit Production", *Materials Safety Soc. Symp. Proc.*, vol. 447 (1996), pp. 145–151.

Lin, et al., "Plasma Polymerization of Trimethylsilane in Cascade Arc Discharge", *J. Appl. Polymer Sci.*, vol. 56 (1997), pp. 1653–1665.

Loboda, et al., "Plasma–enhanced chemical vapor deposition of a–SiC:H films from organosilicon precursors", *J. Vac. Sci. Technol.*, 12(1) (Jan./Feb. 1994), pp. 90–96.

Bar–Ilan, et al., "A comparative study of sub–micron gap filling and planarization techniques", SPIE vol. 2636, pp. 277–288.

Wrobel, et al., "Reactivity of Alkylsilanes and Alkylcarbosilanes in Atomic Hydrogen–Induced Chemical Vapor Deposition", *J. Electrochem. Soc.*, 145(3) (Mar. 1998), pp. 1060–1065.

Grill, et al., "Diamondlike Carbon Materials as Beol Interconnect Dielectrics: Integration Issues", *Electrochem. Soc. Proc.*, 98(3), pp. 118–128.

Grill, et al., "Diamondlike Carbon Materials as Low–k Dielectrics", Conf. Proc. ULSI XII 1997 Materials Research Society, pp. 417–423.

Dobson, et al., "Advanced $SiO_2$ Planarization Using Silane and $H_2O_2$", *Semiconductor International*, (Dec. 1994), pp. 85–88.

Klumpp, et al., "Photoinduced Transformation of Polysiloxane Layer to $SiO_2$", *Applied Surface Science*, vol. 43 (1989), pp. 301–303.

Bogart, et al., "Plasma enhanced chemical vapor deposition of $SiO_2$ using novel alkoxysilane precursors", *J. Vac. Sci. Technol.*, 13(2) (Mar./Apr. 1995), pp. 476–480.

Matsuura, et al., "Novel Self–planarizing CVD Oxide for Interlayer Dielectric Applications", IEDM 94 (1994), pp. 117–120.

Gaillard, et al., "Silicon dioxide chemical vapor deposition using silane and hydrogen peroxide", *J. Vac. Sci Technol.*, 14(4) (Jul./Aug. 1996), pp. 2767–2769.

Grill, et al., "Dielectric constant films prepared by plasma–enhanced chemical vapor deposition from tetramethysilane", *J. Appl. Phys.*, 85(6) (Mar. 15, 1999), pp. 3314–3318.

Luther, et al., "Planar Copper–Polyimide Back End of the Line Interconnections for ULSI Devices", VMIC Conf. (Jun. 8–9, 1993), pp. 15–21.

Rau, et al., "Mechanisms of plasma polymerization of various silico–organic monomers", *Thin Solid Films* 249 (1994), pp. 28–37.

Sahli, et al., "Properties of plasma–polysiloxane deposited by PECVD", *Mat. Chem. & Phys.* 33 (1993), pp. 106–109.

Wrobel, et al., "Oligomeric Products in Plasma–Polymerized Organosilicones", *J. Macromol. Sci–Chem.*, A20(5&6) (1983), pp. 583–618.

Osada, et al., "Oligomeric Products in Plasma–Polymerized Organosiloxanes in the Condensed Phase", *J. Polymer Sci.*, vol. 19 (1981), pp. 369–374.

Favia, et al., "The role of substrate temperature and bias in the plasma deposition from tetramethylsilane", *Plasma Sources Sci. Technol.* (1992), pp. 59–66.

Kim, et al., "Deposition of thermally stable, low dielectric constant fluorocarbon/$SiO_2$ composite thin film", *Appl. Phys. Letters*, 69(18) (Oct. 1999).

Hazari, et al., "Characterization of Alternative Chemistries for Depositing PECVD Silicon Dioxide Films", DUMIC Conf. (Feb. 16–17, 1998), pp. 319–326.

McCabe, et al., "Large Area Diamond–like Carbon Coatings by Ion Implantation", *Surface Engineering Vol. III: Process Technology and Surface Analysis*, (1992), pp. 163–172.

Favia, et al., "Plasma Deposition of Thin Films from a Fluorine–Containing Cyclosiloxane, J. Polymer Sci: Part A" Polymer Chemistry, vol. 22 (199?), John Wiley & Sons Inc.

Wertheimer, et al., "Advances in Basic and Applied Aspects of Microwave Plasma Polymerization", *Thin Solid Films* 115 (1984), pp. 109–124.

Theil, et al., "Carbon content of silicon oxide films. . . . .", *J. Vac. Sci. Technol.*, 12(4) (Jul./Aug. 1994), pp. 1365–1370.

Inagaki, et al., "Plasma Polymerization of Organosilicon Compounds", *J. Appl. Polymer Sci.*, vol. 30 (1984), pp. 3386–3395.

Segui, et al., In Situ Electrical Property Measurements of Metal (Plasma Polysiloxane)/ Metal Structures, *Thin Solid Films* 155 (1987), pp. 175–185.

Segui, et al., "Gas Discharge in Hexamethyldisiloxane", *J. Appl. Polymer Sci.*, vol. 20 (1976), pp. 1611–1618.

Inagaki, et al., "Preparation of Siloxane–Like Films by Glow Discharge Polymerization", *J. Appl. Polymer Sci.*, vol. 29 (1984), pp. 3595–3605.

Nguyen, et al., "Plasma Organosilicon Polymers", *J. Electrochem. Soc.: Solid State Science and Technology* 132(8) (Aug. 1985), pp. 1925–1932.

Taylor, et al. "Parylene Copolymers", 1997 Spring MRS Symposium N, pp. 1–9.

* cited by examiner

PURGE HEATER DESIGN AND PROCESS DEVELOPMENT FOR THE IMPROVEMENT OF LOW K FILM PROPERTIES

BACKGROUND OF THE INVENTION

1. Field of the Invention

The present invention relates to the fabrication of integrated circuits. More particularly, the invention relates to a method and apparatus for depositing a carbon doped silicon oxide layer on a substrate.

2. Background of the Related Art

One of the primary steps in the fabrication of modern semiconductor devices is the formation of metal and dielectric films on a substrate by chemical reaction of gases. Such deposition processes are generally referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. Plasma-enhanced CVD techniques promote excitation and/or disassociation of the reactant gases by the application of radio frequency (RF) energy to a reaction zone, thereby creating a plasma of highly reactive species.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries. Additionally, the density of devices formed on a single die has increased. As dimensions decrease, the number of die per substrate increases. Therefore, a goal in designing and fabricating these electronic devices is to maximize the usable surface area of a substrate.

In order to further reduce the size of devices on integrated circuits, it has become necessary to use conductive materials having low resistivity and insulators having a low dielectric constant (k<4.0) to reduce the capacitive coupling between adjacent metal lines. An example of films having dielectric constants of about 3.0 or less are films deposited from organosilicon compounds, such as organo silanes and organo siloxanes, at conditions sufficient to deposit silicon oxide films containing from about 1% to about 50% carbon by atomic weight.

One issue with carbon doped oxides is the hardness of the film. Soft films are susceptible to damage, particularly at the substrate edge. A typical carbon doped silicon oxide film has a film hardness, in gigapascals (GPa=kg×$10^9$/m sec$^2$), of about 1.2 GPa to about 1.23 GPa. Films having a GPa of less than about 1.2 at the substrate edge have been known to peel during subsequent processing, such as chemical mechanical polishing (CMP).

Another issue which can effect the mechanical properties at the substrate edge is shielding, i.e., preventing deposition around the substrate edge. Typically during CVD, the edge of the substrate is shielded to prevent deposition from about 3 mm from the edge and the backside of the substrate. Backside and edge deposition may cause the substrate to adhere to the support or cause peeling and flaking of the material being deposited resulting in chamber and substrate contamination. Eventually, particulate contamination may clog holes in the showerhead that facilitates passage of precursor gases therethrough necessitating the showerhead be removed and cleaned or replaced. Particulate contamination may also damage other chamber components and substrates resulting in reduced yield, increased down time, and increased production costs. One approach to prevent backside and edge deposition is to shield the edge of the substrate with a shadow ring. Another approach is to route a purge gas through holes in the substrate support to prevent deposition at the edge and backside of the substrate. While shielding is effective in preventing contamination damage, shielding may contribute to other damage, such as poor adhesion and peeling, at the substrate edge during subsequent processing. Shielding the substrate edge also reduces the usable surface area of the substrate.

Therefore, there is a need for a method and apparatus for depositing carbon doped silicon oxide films which improves susceptibility to damage during subsequent processing.

SUMMARY OF THE INVENTION

In one aspect, a process of depositing a carbon doped silicon oxide film having a low dielectric constant (k) on a substrate is provided in which a substrate is positioned in a chamber on a substrate support; a carrier gas, such as an inert gas, is flowed into to the chamber; a process gas mixture is flowed adjacent an edge of the substrate through a purge gas inlet in the substrate support; a plasma is generated, a first carbon silicon gas source is delivered to the chamber, and a carbon doped silicon oxide film is deposited on the substrate.

In another aspect, a film is produce by positioning a substrate in a chamber on a substrate support, flowing a carrier gas into the chamber through a gas inlet, flowing a process gas mixture adjacent an edge of a substrate through a purge gas inlet in the substrate support, generating a plasma, delivering a first carbon silicon gas source to the chamber through a gas inlet, and depositing a film on the substrate having a greater concentration of silicon oxide and a greater hardness around the edge of the substrate than an inner portion of the substrate.

In yet another aspect, a purge heater assembly has a ceramic upper plate and a ceramic lower plate defining a channel therethrough, one or more alignment pin holes disposed in an outside perimeter of the substrate support, an annular purge gas inlet disposed around an outside edge of the upper plate, a shadow ring having one or more alignment pin recesses disposed therein, wherein the upper plate and the shadow ring are machined to form a gap of a predetermined size, and a ceramic shaft having an annular passage therethrough.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Aspects of the invention are described in reference to a method for depositing a silicon oxide layer having a low dielectric constant. The silicon oxide layer(s) are produced from organosilicon compounds containing carbon in organo groups that are not readily removed by oxidation at processing conditions. Suitable organo groups include alkyl, alkenyl, cyclohexenyl, and aryl groups and functional derivatives. The organosilicon compounds include:

formed from oxidized organosilicon compounds have dielectric constants of less than about 3.0 and low moisture content.

Figure 1:
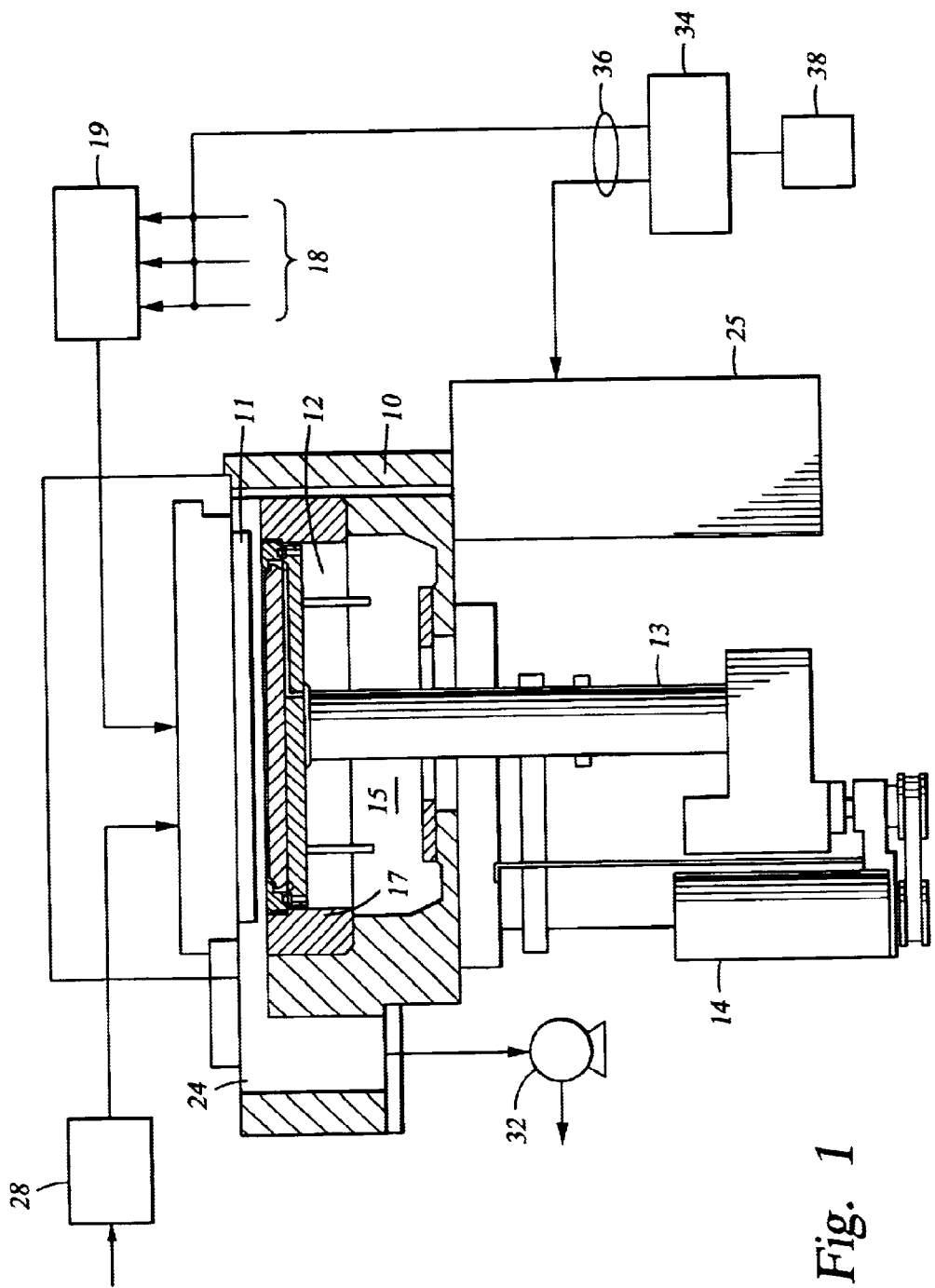
FIG. 1 is a cross-sectional diagram of an exemplary CVD plasma reactor configured for use according to the present invention.

FIG. 1 shows a vertical, cross-sectional view of a parallel plate chemical vapor deposition reactor 10 having a high vacuum region 15. The reactor 10 contains a gas distribution manifold 11 (e.g., a showerhead) for dispersing process gases through perforated holes in the manifold to a substrate or wafer (not shown) that rests on a substrate support plate or susceptor 12 which is raised or lowered by a lift motor 14.

The reactor 10 includes heating of the process gases and substrate, such as by resistive heating coils (not shown) or external lamps (not shown). Susceptor 12 is mounted on a support stem 13 so that susceptor 12 (and the wafer supported The reactor 10 includes heating of the process gases and substrate, such as by resistive heating coils (not shown) or external lamps (not shown). Susceptor 12 is mounted on a support stem 13 so that susceptor 12 (and the wafer supported on the upper surface of susceptor 12) can be controllably moved between a lower loading/off-loading position and an upper processing position adjacent to the manifold 11.

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| tetramethylsilane, | $(CH_3)_4$—$Si$ |
| dimethylsilanediol, | $(CH_3)_2$—$Si$—$(OH)_2$ |
| ethylsilane, | $CH_3$—$CH_2$—$SiH_3$ |
| phenylsilane, | $C_6H_5$—$SiH_3$ |
| diphenylsilane, | $(C_6H_5)_2$—$SiH_2$ |
| diphenylsilanediol, | $(C_6H_5)_2$—$Si$—$(OH)_3$ |
| methylphenylsilane, | $C_6H_5$—$SiH_2$—$CH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —(—$SiH_2CH_2$-$)_3$-(cyclic) |
| dimethyldimethoxysilane, | $(CH_3)_2$—$Si$—$(OCH_3)_2$ |
| diethyldiethoxysilane, | $(CH_3CH_2)_2$—$Si$—$(OCH_2CH_3)_2$ |
| dimethyldiethoxysilane, | $(CH_3)_2$—$Si$—$(OCH_2CH_3)_2$ |
| diethyldimethoxysilane, | $(CH_3CH_2)_2$—$Si$—$(OCH_3)_2$ |
| 1,3-dimethyldisiloxane, | $CH_3$—$SiH_2$—$O$—$SiH_2$—$CH_3$ |
| 1,1,3,3-tetramethyldisiloxane, | $(CH_3)_2$—$SiH$—$O$—$SiH$—$(CH_3)_2$ |
| hexamethyldisiloxane, | $(CH_3)_3$—$Si$—$O$—$Si$—$(CH_3)_3$ |
| hexamethylcyclotrisiloxane | —(—$Si(CH_3)_2$—$O$-$)_3$-(cyclic) |
| hexaphenylcyclotrisiloxane | —(—$Si(C_6H_5)_2$—$O$-$)_3$-(cyclic) |
| 1,3-bis(silanomethylene)disiloxan, | $(SiH_3$—$CH_2$—$SiH_2$—$)_2$—$O$ |
| bis(1-methyldisiloxanyl)methane, | $(CH_3$—$SiH_2$—$O$—$SiH_2$—$)_2$—$CH_2$ |
| 2,2-bis(1-methyldisiloxanyl)propane, | $(CH_3$—$SiH_2$—$O$—$SiH_2$—$)_2$—$C(CH_3)_2$ |
| 2,4,6,8-tetraethylcyclotetrasiloxane | —(—$SiH(C_2H_5)$—$O$-$)_4$-(cyclic) |
| 2,4,6,8-tetramethylcyclotetrasiloxane (TMCTS), | —(—$SiH(CH_3)$—$O$-$)_4$-(cyclic) |
| octamethylcyclotetrasiloxane (OMCTS), | —(—$Si(CH_3)_2$—$O$-$)_4$-(cyclic) |
| octaphenylcyclotetrasiloxane | —(—$Si(C_6H_5)_2$—$O$-$)_4$-(cyclic) |
| 2,4,6,8,10-pentamethylcyclopentasiloxane, | —(—$SiHCH_3$—$O$-$)_5$-(cyclic) |
| decamethylcyclopentasiloxane | —(—$Si(CH_3)_2$—$O$-$)_5$-(cyclic) |
| 1,3,5,7-tetrasilano-2,6-dioxy-4,8-dimethylene, | —(—$SiH_2$—$CH_2$—$SiH_2$—$O$-$)_2$-(cyclic) |
| 2,4,6-trisilanetetrahydropyran, | —$SiH_2$—$CH_2$—$SiH_2$—$CH_2$—$SiH_2$—$O$-(cyclic) |
| 2,5-disilanetetrahydrofuran, | —$SiH_2$—$CH_2$—$CH_2$—$SiH_2$—$O$-(cyclic), |
| and fluorinated derivatives thereof. | |

The organosilicon compounds are oxidized during deposition, preferably by reaction with oxygen ($O_2$), ozone ($O_3$), or oxygen containing compounds such as nitrous oxide ($N_2O$), carbon monoxide (CO), carbon dioxide ($CO_2$), and water ($H_2O$), preferably $O_2$ and $N_2O$. Organosilicon compounds that contain oxygen may be decomposed to provide the oxygen. Preferably, the carbon to silicon ratio in the film is between about 1:9 and about 1:1. The deposited films When susceptor 12 and the wafer are in the processing position, they are surrounded by an insulator 17 and process gases exhaust into a manifold 24. During processing, gases inlet to manifold 11 are uniformly distributed radially across the surface of the wafer. A vacuum pump 32 having a throttle valve controls the exhaust rate of gases from the chamber.

Before reaching manifold 11, deposition and carrier gases are input through gas line 18 into a mixing system 19 where they are combined and then sent to manifold 11. Generally, the supply line 18 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or a plasma enhanced process. In a plasma enhanced process, a controlled plasma is typically formed adjacent to the wafer by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12.

When additional dissociation of the oxidizing gas is desired, an optional microwave chamber 28 (shown in phantom) can be used to input from between about 0 Watts and about 6000 Watts of microwave power to the oxidizing gas prior to entering the deposition chamber. Separate delivery of microwave power would avoid excessive dissociation of the organosilicon compounds prior to reaction with the oxidizing gas. A gas distribution plate having separate passages for the organosilicon compound and the oxidizing gas is preferred when microwave power is added to the oxidizing gas.

The lift motor 14 raises and lowers susceptor 12 between a processing position and a lower, wafer-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus.

The system controller 34 operates under the control of a computer program stored on the hard disk drive 38. The computer program dictates the timing, mixture of gases, RF power levels, susceptor position, and other parameters of a particular process.

Figure 2:
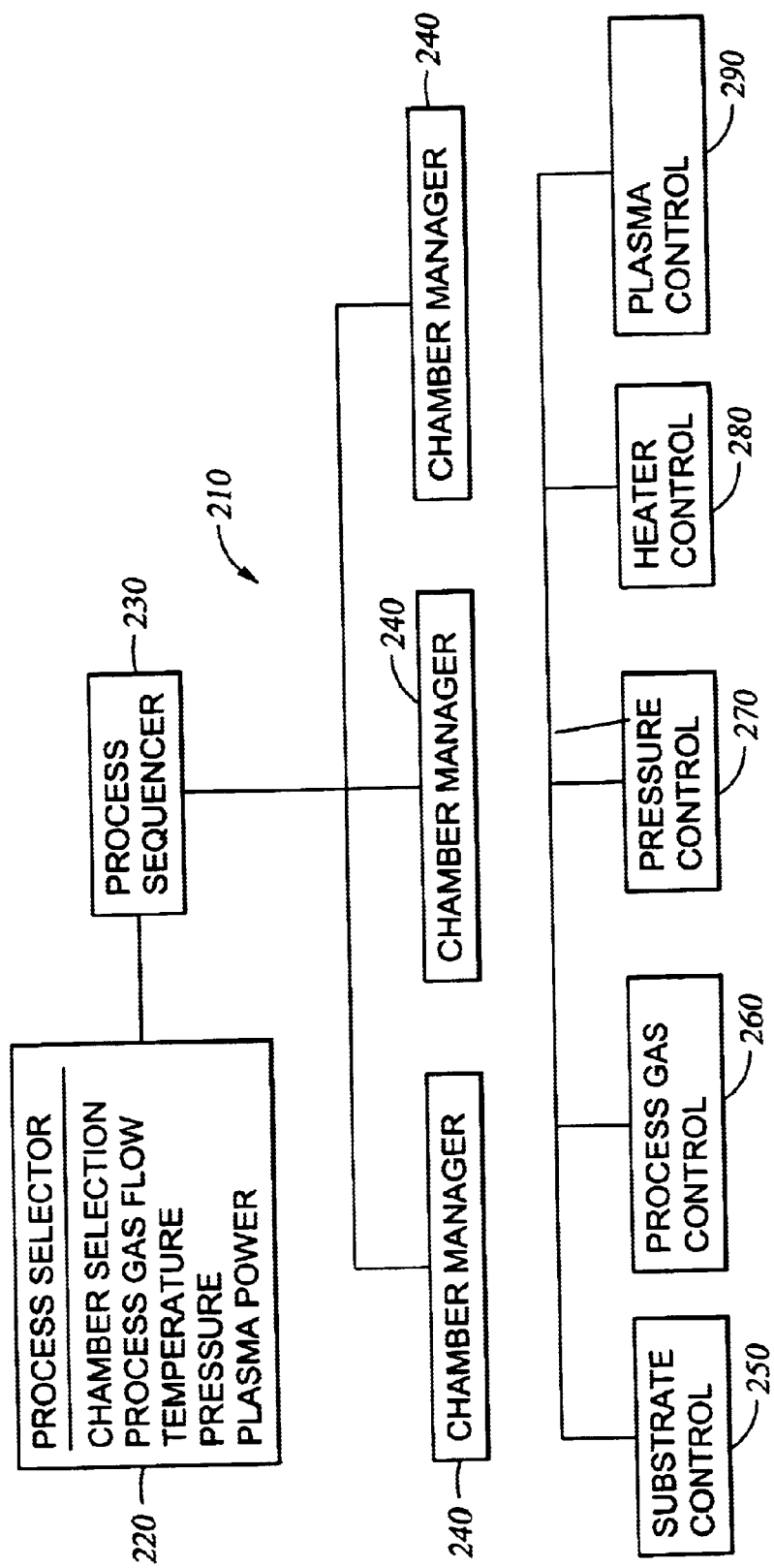
FIG. 2 is a flowchart of a process control computer program product used in conjunction with the exemplary CVD plasma reactor of FIG. 1.

Referring to FIG. 2, processes can be implemented using a computer program product 210 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 210. A user enters a process set number and process chamber number into a process selector subroutine 220 in response to menus or screens displayed on a CRT monitor (not shown) by using a light pen interface (not shown). The process sets are predetermined sets of process parameters necessary to carry out specified processes, and are identified by predefined set numbers. The process selector subroutine 220 the (i) selects a desired process chamber on a cluster tool such as an Centura® platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 230 comprises program code for accepting the identified process chamber and set of process parameters from the process selector subroutine 220, and for controlling operation of the various process chambers. Multiple users can enter process set numbers and process chamber numbers, or a user can enter multiple process chamber numbers, so the sequencer subroutine 230 operates to schedule the selected processes in the desired sequence. Preferably the sequencer subroutine 230 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 230 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 230 determines which process chamber and process set combination is going to be executed next, the sequencer subroutine 230 causes execution of the process set by passing the particular process set parameters to a chamber manager subroutine 240 which controls multiple processing tasks in a process chamber 10 according to the process set determined by the sequencer subroutine 230. For example, the chamber manager subroutine 240 comprises program code for controlling CVD process operations in the process chamber 10. The chamber manager subroutine 240 also controls execution of various chamber component subroutines which control operation of the chamber component necessary to carry out the selected process set. Examples of chamber component subroutines are susceptor control subroutine 250, process gas control subroutine 260, pressure control subroutine 270, heater control subroutine 280, and plasma control subroutine 290. Those having ordinary skill in the art would readily recognize that other chamber control subroutines can be included depending on what processes are desired to be performed in the reactor 10.

In operation, the chamber manager subroutine 240 selectively schedules or calls the process component subroutines in accordance with the particular process set being executed. The chamber manager subroutine 240 schedules the process component subroutines similarly to how the sequencer subroutine 230 schedules which process chamber 10 and process set is to be executed next. Typically, the chamber manager subroutine 240 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 250 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 250 controls movement of the susceptor 12 in response to process set parameters that are transferred from the chamber manager subroutine 240.

The process gas control subroutine 260 has program code for controlling process gas composition and flow rates. The process gas control subroutine 260 controls the open/close position of the safety shut-off valves, and also ramps up/down the mass flow controllers to obtain the desired gas flow rate. The process gas control subroutine 260 is invoked by the chamber manager subroutine 240, as are all chamber components subroutines, and receives from the chamber manager subroutine process parameters related to the desired gas flow rates. Typically, the process gas control subroutine 260 operates by opening the gas supply lines, and repeatedly (i) reading the necessary mass flow controllers, (ii) comparing the readings to the desired flow rates received from the chamber manager subroutine 240, and (iii) adjusting the flow rates of the gas supply lines as necessary. Furthermore, the process gas control subroutine 260 includes steps for monitoring the gas flow rates for unsafe rates, and activating the safety shut-off valves when an unsafe condition is detected.

The pressure control subroutine 270 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 270 is invoked, the desired, or target pressure level is received as a parameter from the chamber manager subroutine 240. The pressure control subroutine 270 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 270 can be written to open or close the throttle valve to a particular opening size to regulate the reactor 10 to the desired pressure.

The heater control subroutine 280 comprises program code for controlling the temperature of the heat modules or radiated heat that is used to heat the susceptor 12. The heater control subroutine 280 is also invoked by the chamber manager subroutine 240 and receives a target, or set point, temperature parameter. The heater control subroutine 280 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 280 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 290 comprises program code for setting the RF bias voltage power level applied to the process electrodes in the reactor 10, and optionally, to set the level of the magnetic field generated in the reactor. Similar to the previously described chamber component subroutines, the plasma control subroutine 290 is invoked by the chamber manager subroutine 240.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Figure 3:
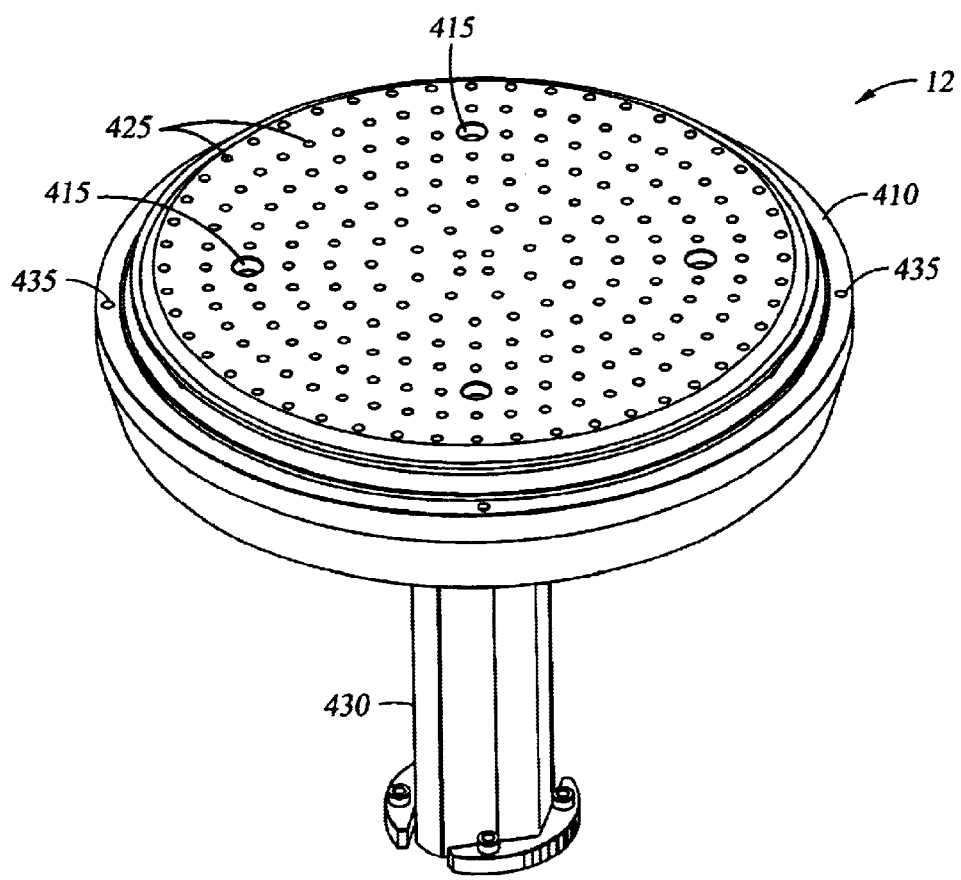
FIG. 3 is a top view a susceptor according to one aspect of the present invention.

FIG. 3 is a top view of a susceptor 12 according to one embodiment of the invention. The susceptor 12 generally includes a substrate support 410 and a shaft 430. The substrate support 410 is comprised of a first (upper) plate 420 and a second (lower) plate 445 (shown in FIGS. 4 and 5) having a slightly larger diameter than the upper plate 420. The substrate support 410 includes one or more alignment pin holes 435 disposed through an outer edge of the substrate support 410 to receive one or more alignment pins 550 (shown in FIG. 5). The upper plate 420 supports a substrate during processing and has a surface area about equal to the area of a substrate to be processed so that there is minimal overhang of the substrate around an edge of the upper plate 420. The lower plate 445 generally has a first side that is connected to the upper plate 420 and a second side that is connected to the shaft 430. The upper plate 420 and lower plate 445 are typically fused together, for example, by clamping the plates 420 and 445 together at an elevated temperature for a period of time, typically without a bonding agent. Alternatively, the plates may be coupled by sintering, adhesives, mechanical means (i.e., fasteners), and the like. The upper plate 420 is fabricated from ceramic, such as aluminum nitride. Preferably, about 95 percent pure aluminum nitride is used to enhance the thermal conductivity of the upper plate 420.

Figure 4:
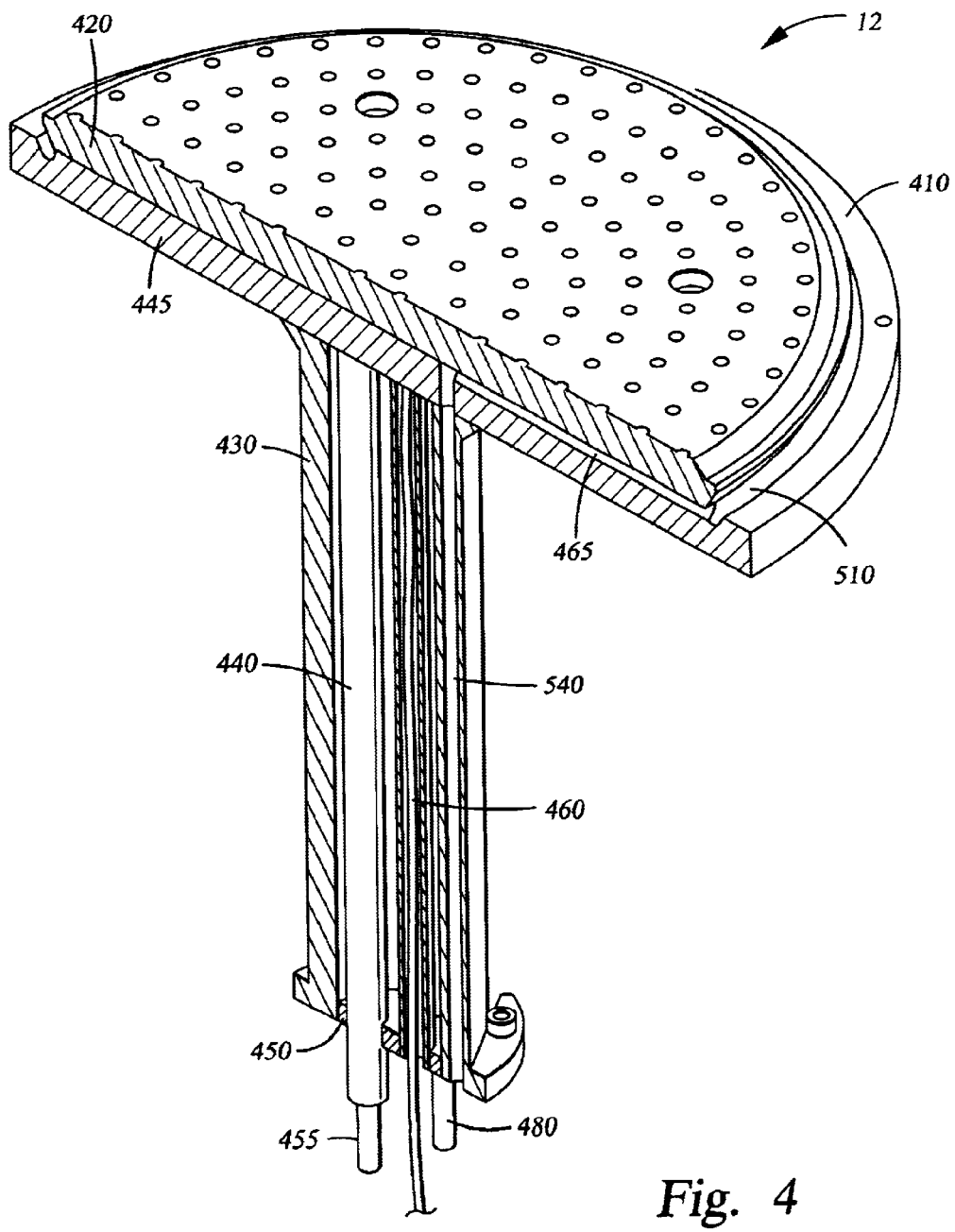
FIG. 4 is a cross-sectional view of the susceptor shown in FIG. 3.

FIG. 4 is a cross-sectional view of the susceptor 12 shown in FIG. 3. The lower plate 445 is also fabricated from ceramic, such as aluminum nitride. Preferably, about 95 percent pure aluminum nitride is used to enhance the thermal conductivity of the lower plate 445. The lower plate 445 includes at least one heating element, such as an embedded RF electrode (not shown), connected to one or more electrode pins 455. One or more leads 460 extend through the second side of the lower plate 445. The leads 460 extend through the shah 430 to an RF terminal 480 connected to the RF power source 25 for grounding the susceptor 12. The power source 25 supplies power to the electrode to enable the substrate support 410 to heat a substrate to a temperature in the range of about 300° C. to about 550° C. The lower plate 445 includes a vacuum passage (not shown) which extends through the upper plate 420 to a plurality of vacuum ports 425 disposed in a top surface of the upper plate 420 for vacuum chucking a substrate to the support 410. Alternatively, the vacuum passage may be eliminated and the substrate held in place by surface friction or gravity. Additionally, the lower plate 445 includes a purge passage 540 and a plurality of lift pin passages 415 extending therethrough. The lift pin passages 415 are generally disposed radially outwards from the vacuum passage and the purge passage 540. The lift pin passages 415 extend from the lower plate 445 through upper plate 420, exiting through the top surface of the upper plate 420.

A channel 465 is formed between the upper and lower plates 420 and 445. Generally, the channel 465 provides a passage for a processing gas mixture through the substrate support 410 to a purge gas inlet 510 partially defined between a shadow ring 520 and the substrate support 410. The process gas mixture flows from a source (not shown) through a purge passage 540 disposed in the shaft 430 and the channel 465 disposed in the substrate support 410 to the purge gas inlet 510. The shadow ring 520 is sealably disposed on the substrate support 410 forcing substantially all of the process gas mixture flowing from the channel 465 through the purge gas inlet 510 and out a gap 570. The process gas mixture is then directed over the edge of the substrate to enhance deposition at the substrate edge.

Typically, the channel 465 is formed in the upper plate 420. Optionally, a portion or all of channel 465 may be disposed completely in the lower plate 445. Optionally, some or all of the channel 465 may be disposed at least partially in the upper plate 420 and at least partially in the lower plate 465 or various combinations thereof. Common to these embodiments is that the mating of the surfaces of the upper and lower plates 420, 445 define the channel 465 and confine travel of fluids therein.

The shaft 430 generally is fabricated from ceramic, such as aluminum nitride. Typically about 99 percent pure aluminum nitride is preferred to minimize thermal transfer between the substrate support 410 and shaft 430. The shaft 430 is generally tubular in cross section. The shaft 430 has an annular section that defines a central passage. A first projection and a second projection extend from the annular section. The first projection has a purge passage 540 and the second projection has a vacuum passage respectively disposed therethrough. The thickness of the annular section and the walls of the first and second projections are selected to minimize thermal conductivity therethrough.

The shaft has a first end and a second end. The first end is connected (i.e., fused, bonded or sintered) to the second side of the lower plate 445. One or more ceramic sleeves 440 and pin retainers 450 are disposed in the central passage of the shaft 430 and extend partially through the second end. The pin retainer 450 holds the one or more sleeves 440 in place to avoid excessive stress on the pins 455.

Figure 5:
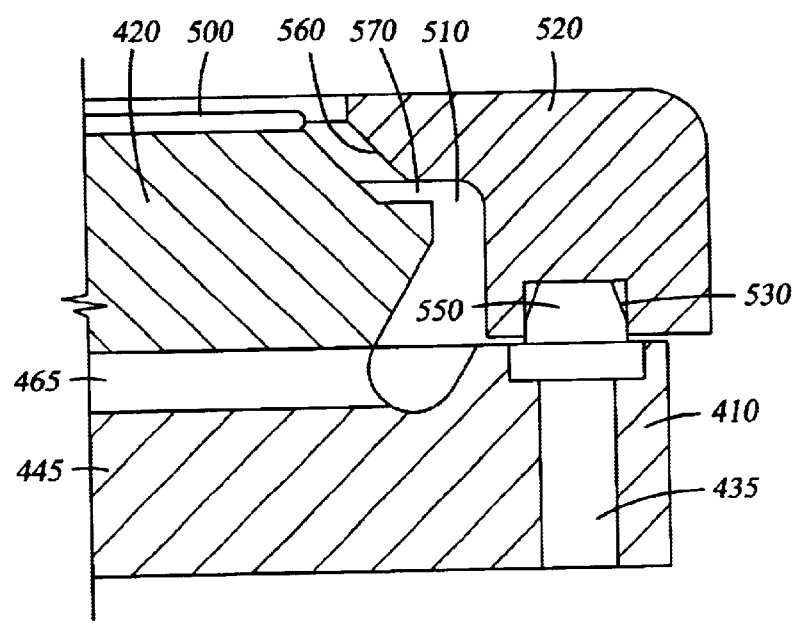
FIG. 5 is an exploded perspective view of the susceptor shown in FIG. 3.

FIG. 5 is an exploded perspective view of the susceptor of FIG. 3. An annular purge gas inlet 510 is disposed circumferentially around an outer perimeter of the upper plate 420 and defined by the upper plate 420, the lower plate 445, and the shadow ring 520. The shadow ring 520 has one or more alignment pin recesses 530 disposed therein to receive one or more alignment pins 550 disposed through the alignment pin holes 435 in the outer edge of the substrate support 410. The channel 465 is connected to the purge gas inlet 510 at one or more intersections allowing the process gas mixture to flow around a perimeter of a substrate 500. The shadow ring 520 is supported by engaging the one or more alignment pin recesses with the one or more alignment pins 550 thereby forming the gap 570 between the shadow ring 520 and the upper plate 420 of the substrate support 410. The outer perimeter of the upper plate 420 and an inside ledge 560 of the shadow ring are machined to form the gap 570 of a predetermined size to achieve a desired flow rate through the purge gas inlet 510, between about 1 sccm and about 150 sccm.

Figure 6:
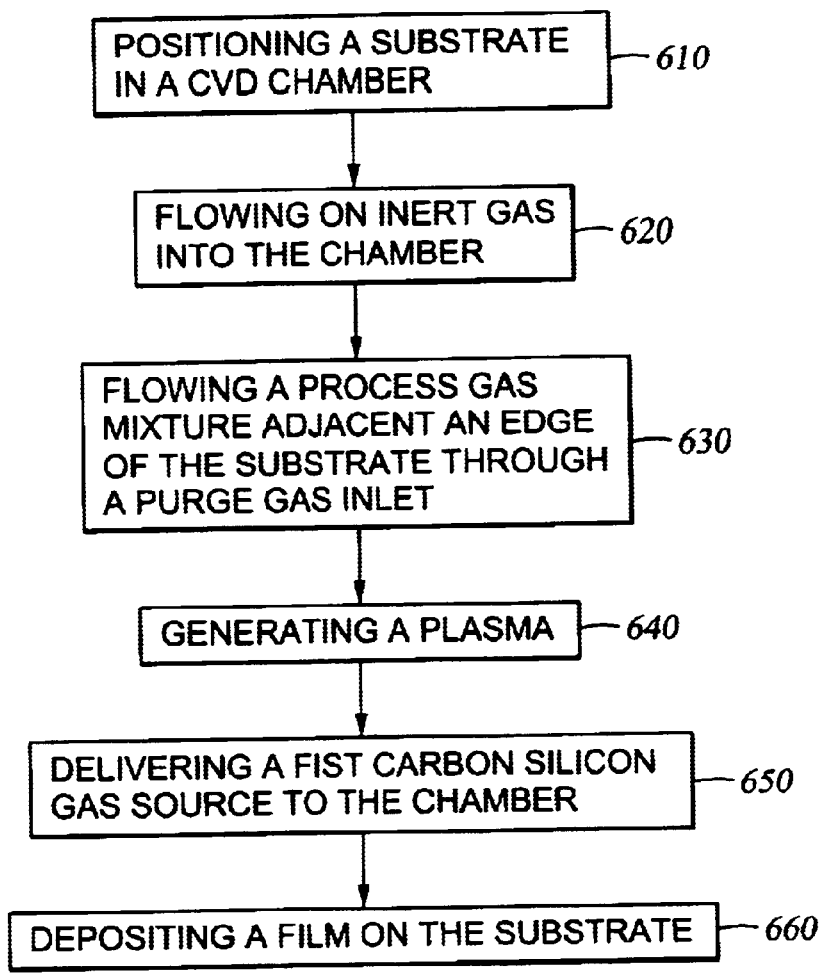
FIG. 6 is a flowchart showing the processing steps of the present invention.

FIG. 6 is a flowchart representing a method for depositing a carbon doped silicon oxide film having a low dielectric constant (k) on a substrate. Generally in step 610, a substrate is positioned in a chamber, such as the CVD chamber 10 shown in FIG. 1, on a substrate support or susceptor 12. Then in step 620, a carrier gas, such as argon or helium, is introduced into the chamber at a flow rate of about 500 sccm to about 2000 sccm, preferably about 1000 sccm. The pressure within the processing chamber 10 is regulated between about 2 Torr and about 6 Torr, preferably about 4 Torr, by vacuum source 32, such as a vacuum pump. The susceptor 12 is used to heat the substrate and maintain the substrate temperature from about 300° C. to about 400° C., preferably about 350° C. Additionally, a liquid heat exchanger is provided to regulate the chamber temperature. A suitable heated liquid, at about 65° C., is flown through the chamber to stabilize the temperature.

In step 630, process gas mixture containing an oxidizer, such as oxygen or ozone ($O_3$), and/or a carrier gas, such as argon or helium, and a carbon silicon gas source, such as those listed above or a combination thereof, is supplied adjacent an edge of the substrate through purge gas inlet 510 of susceptor 12 at a flow rate of about 1 sccm to about 150 sccm, preferably about 100 sccm. In one aspect, it is contemplated that one or more carbon silicon gas sources may be used to advantage with the invention. The carbon silicon gas sources are supplied to the chamber through the manifold 11, or showerhead, and/or a purge gas inlet in the susceptor 12. In another aspect, it is contemplated that a self-oxidizing carbon silicon gas source eliminates the need for a separate oxidizer. In yet another aspect, it is contemplated that tetraethyl orthosilicate (TEOS) may be delivered through the purge gas inlet in the susceptor 12 to increase the concentration of silicon oxide at the edge of the substrate.

An RF power supply 25 delivers power to the chamber at a level of about 100 W to about 1500 W, preferably about 1300 W. Then in step 640, a plasma is ignited in the process chamber 10. Next in step 650, another carbon silicon gas source, of the same or different composition as the source supplied adjacent the edge of the substrate, is delivered to the chamber through the manifold 11, or showerhead, at a flow rate of about 500 sccm to about 1700 sccm. Alternatively, the carbon silicon gas source may be delivered to the chamber through one or more gas inlets or nozzles instead of through the showerhead. It is also contemplated that a second oxidizer may be introduced into the chamber at a flow rate of about 150 sccm to about 800 sccm through the manifold or one or more gas inlets. However, it is contemplated that flowing an oxidizer through the purge gas inlet in the susceptor may provide sufficient oxidation for the desired film without the need for a second oxidizer being introduced into the chamber. In step 660, a low k carbon doped silicon oxide film having a greater concentration of silicon oxide at the edge of the substrate is deposited.

The resultant film has a slightly greater hardness, Young's modulus (tensile stress/tensile strain), and dielectric constant at the edge of the substrate than at the inner portion of the substrate. This result is believed to be due to a less porous and more oxide like composition at the edge. However, the overall dielectric constant across the substrate is maintained. According to one aspect of the invention, the mechanical properties of the film improve resistance to peeling during subsequent processing, such as copper deposition where the edge may be clamped down or chemical mechanical polishing (CMP). Test results show that substrates processed according to a method of the invention yielded a GPa of about 1.3 to about 1.4. The dielectric constant at the substrate's edge was increased to slightly greater than about 2.85 to about 2.95. However, the net increase across the substrate was marginal.

EXAMPLES

The following example demonstrates deposition of a carbon doped silicon oxide film having a more oxide-like composition within about 1 mm from the edge of the substrate. The example was undertaken using a chemical vapor deposition chamber, and in particular, a "CENTURA DxZ" system which includes a solid-state RF matching unit with a two-piece quartz process kit, both fabricated and sold by Applied Materials, Inc., of Santa Clara, Calif.

A carbon doped silicon oxide film was deposited at a chamber pressure of 3.0 Torr and temperature of 0° C. from reactive gases which were flown into the reactor as follows:

| | |
|---|---|
| Methyl silane, CH3SiH3, through a showerhead at | 55 sccm |
| Argon, Ar, through the showerhead at | 1000 sccm |
| Oxygen, O2, through the purge gas inlet at | 40 sccm |

The substrate was positioned 600 mils from the gas distribution showerhead and 80 W of high frequency power (3 MHz) was applied to the showerhead for plasma enhanced deposition of a carbon doped silicon oxide film.

The deposited film had a dielectric constant of 2.86 and a hardness of 0.95 GPa at the center of a 200 mm wafer, and a dielectric constant of 2.87 and a hardness of 1.21 5 mm from the edge of the substrate. Additionally, the film had a hardness of 1.29 3 mm from the edge of the substrate. The hardness increases about 35% from the center to the edge. Furthermore, SIMS analysis shows the oxygen concentration of the film at the edge of the substrate (about 1 mm) increases about 56% compared to the film composition at the center of the substrate.

While foregoing is directed to the preferred embodiment of the present invention, other and further embodiments of the invention may be devised without departing from the basic scope thereof, and the scope thereof is determined by the claims that follow.

What is claimed is:

1. A method for depositing a film on a substrate, comprising:

positioning a substrate in a chamber on a substrate support;

flowing a carrier gas into the chamber;

flowing a process gas mixture adjacent an edge of the substrate through a purge gas inlet in the substrate support;

generating a plasma;

delivering a first carbon silicon gas source to the chamber through another gas inlet; and depositing on the substrate a film that has a different composition at the edge of the substrate than at the center of the substrate.

2. The method of claim 1, wherein the process gas mixture delivered to the edge of the substrate comprises an oxidizer and a carrier gas.

3. The method of claim 2, wherein the process gas mixture is delivered to the edge of the substrate through the purge gas inlet at a flow rate of about 1 sccm to about 150 sccm.

4. The method of claim 3, wherein the process gas mixture delivered to the edge of the substrate further comprises a second carbon silicon gas source.

5. The method of claim 4, wherein the first and second carbon silicon gas sources are selected from the group consisting of methylsilane, dimethylsilane, trimethylsilane, tetramethylsilane, disilanomethane, bis(methyl-silano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,1,3,3-tetramethyldisiloxane, 1,3-bis(silanomethylene)di-siloxane, bis(1-methyldisiloxanyl)methane, 2,2-bis(1-methyl-disiloxanyl)propane, 2,4,6,8-tetramethylcyclotetrasiloxane (TMCTS), 2,4,6,8,10-pentamethylcyclopentasiloxane, 1,3,5,7-tetra-silano-2,6-dioxy-4,8-dimethylene, 2,4,6-trisilanetetrahydropyran, 2,5-disilanetetrahydrofuran, fluorinated carbon derivatives thereof, and combinations thereof.

6. The method of claim 5, wherein the carrier gas in the process mixture delivered to the edge of the substrate is selected from the group consisting of argon, helium, and combinations thereof.

7. The method of claim 6, wherein the oxidizer delivered to the edge of the substrate is selected from the group consisting of oxygen ($O_2$), carbon monoxide (CO), carbon dioxide ($CO_2$), water ($H_2O$), nitrous oxide ($N_2O$), and ozone ($O_3$).

8. The method of claim 7, wherein the first carbon silicon gas source is delivered to the chamber at a flow rate of about 500 sccm to about 1700 sccm.

9. The method of claim 7, wherein the substrate is maintained at a temperature of about 300° C. to about 400° C.

10. The method of claim 9, wherein a chamber pressure is maintained from about 2 Torr to about 6 Torr.

11. The method of claim 10, further comprising:
supplying an RF power source to the chamber at a power level from about 100 W to about 1500 W.

12. The method of claim 11, further comprising:
flowing a second oxidizer into the chamber at a flow rate of about 150 sccm to about 800 sccm.

13. The method of claim 3, wherein the process gas mixture delivered to the edge of the substrate further comprises tetraethyl orthosilicate (TEOS).

14. The method of claim 1, wherein the process gas mixture delivered to the edge of the substrate comprises a self-oxidizing carbon silicon gas source.

15. The method of claim 14, wherein the first carbon silicon gas source delivered to the chamber is self-oxidizing.

16. The method of claim 1, wherein the film has a higher concentration of oxygen at the edge of the substrate than at the center of the substrate.

17. A method for depositing a film on a substrate, comprising:
positioning a substrate in a chamber on a substrate support;
flowing a carrier gas into the chamber;
flowing a process gas mixture comprising an oxygen source adjacent an edge of the substrate through a purge gas inlet in the substrate support;
generating a plasma;
delivering a first carbon silicon gas source to the chamber through another gas inlet; and
depositing on the substrate a film that has a higher concentration of silicon oxide at the edge of the substrate than at the center of the substrate.

18. The method of claim 17, wherein the oxygen source is selected from the group consisting of oxygen, ozone, and tetraethyl orthosilicate.

19. The method of claim 17, further comprising delivering an oxidizer to the chamber through a gas inlet other than the purge gas inlet.

20. The method of claim 17, wherein the process gas mixture delivered to the edge of the substrate further comprises a second carbon silicon gas source.

21. A method for depositing a film on a substrate, comprising:
positioning a substrate in a chamber on a substrate support;
flowing a carrier gas into the chamber;
flowing a process gas mixture comprising an oxygen source adjacent an edge of the substrate through a purge gas inlet in the substrate support;
generating a plasma;
delivering a first carbon silicon gas source consisting of carbon, silicon, and hydrogen to the chamber through another gas inlet; and
depositing a film comprising oxygen on the substrate, wherein the film has a different composition at the edge of the substrate than at the center of the substrate.

22. The method of claim 21, wherein the first carbon silicon gas source is selected from the group consisting of methylsilane, dimethylsilane, trimethylsilane, tetramethylsilane, disilanomethane, bis(methyl-silano)methane, 1,2-disilanoethane, 1,2-bis(methylsilano)ethane, 2,2-disilanopropane, 1,3,5-trisilano-2,4,6-trimethylene, ethylsilane, phenylsilane, diphenylsilane, methylphenylsilane, and combinations thereof.

* * * * *

UNITED STATES PATENT AND TRADEMARK OFFICE
CERTIFICATE OF CORRECTION

PATENT NO. : 6,709,721 B2
DATED : March 23, 2004
INVENTOR(S) : Rocha-Alvarez et al.

It is certified that error appears in the above-identified patent and that said Letters Patent is hereby corrected as shown below:

Column 9,
Line 27, please change "shah" to -- shaft --.

Column 11,
Line 58, please change "CH3SiH3" to -- $CH_3SiH_3$ --.

Signed and Sealed this

Thirtieth Day of November, 2004

JON W. DUDAS
*Director of the United States Patent and Trademark Office*